United States Patent [19]

Sikora

[11] Patent Number: 5,420,078

[45] Date of Patent: May 30, 1995

[54] METHOD FOR PRODUCING VIA HOLES IN INTEGRATED CIRCUIT LAYERS

[75] Inventor: Robert M. Sikora, Mesa, Ariz.

[73] Assignee: VLSI Technology, Inc., San Jose, Calif.

[21] Appl. No.: 277,358

[22] Filed: Jul. 19, 1994

Related U.S. Application Data

[63] Continuation of Ser. No. 59,876, May 10, 1993, abandoned, which is a continuation of Ser. No. 744,861, Aug. 14, 1991, abandoned.

[51] Int. Cl.$^6$ .......................................... H01L 21/465
[52] U.S. Cl. .................................... 437/228; 437/235; 437/947
[58] Field of Search .................. 437/228, 235, 947; 156/644, 651

[56] References Cited

U.S. PATENT DOCUMENTS

| | | | |
|---|---|---|---|
| 4,372,034 | 2/1983 | Bohr | 437/51 |
| 4,857,141 | 8/1989 | Abe et al. | 437/238 |
| 5,057,186 | 10/1991 | Chew et al. | 156/643 |
| 5,078,832 | 1/1992 | Tanaka | 156/639 |

OTHER PUBLICATIONS

Semiconductor International, Etching of SiO$_2$ by Controlled Anhydrous HF/Vapor, 1987.
FSI International, Excalibur Gas Processing System, The Cost-Effective, Virtually Particle-Free Solution to Silicon Dioxide Removal (date unknown).
Etching of SiO$_2$ by Controlled Anhydrous HF/Vapor J. of Semiconductor International Sep. 1989.
Bilayer Taper Etching of Field Oxides and Passivation Layers L. White, J. Electrochemical Society Dec. 1980 pp. 2687-2693.

*Primary Examiner*—Olik Chaudhuri
*Assistant Examiner*—H. Jey Tsai
*Attorney, Agent, or Firm*—Hickman & Beyer

[57] ABSTRACT

A method for forming via holes characterized by an isotropic etch of a dielectric surface through a mask opening by means of an acidic vapor, followed by an anisotropic etch through mask openings into the body of the dielectric surface. Preferably, the acidic vapor comprises hydrofluoric (HF) acid and a nitrogen (N$_2$) carrier gas. The isotropic etch step undercuts the mask around the mask openings to form tapered recesses which subsequently become tapered via hole rims after the anisotropic etch step.

22 Claims, 4 Drawing Sheets

METHOD FOR PRODUCING VIA HOLES IN INTEGRATED CIRCUIT LAYERS

This is a continuation of application Ser. No. 08/059,876, filed May 10, 1993, now abandoned, which is a continuation of application Ser. No. 07/744,861, filed Aug. 14, 1991, now abandoned.

BACKGROUND OF THE INVENTION

This invention relates generally to integrated circuit processing and more particularly to methods for etching via holes in a dielectric layer of an integrated circuit.

Integrated circuits are formed on a semiconductor wafer by subjecting the wafer to a number of processing steps. These processing steps include the deposition of various types of layers, the formation of masks over such layers, the etching of the layers through the masks, the doping of layers, etc. After the integrated circuits are formed, the wafer is cut into a number of dies, each of which includes an integrated circuit, and the dies are then packaged to complete the integrated circuit assembly.

An important processing step is the formation of vias through a dielectric layer which separates two conductive and/or semiconductive layers. Via holes are formed by first covering the dielectric surface with a photoresist mask typically provided with a great number of openings and then etching the dielectric surface through the mask openings. A conductive material, such as aluminum, is then deposited over the surface and within the via holes. Finally, the conductive material over the surface is fully or partially removed to leave conductive vias through the dielectric surface.

A prior art method for forming vias will be discussed with reference to FIG. 1a which shows a substrate layer $S_a$, a dielectric layer $D_a$, and a via hole $V_a$. A conductive layer $L_a$ is typically formed by a sputter deposition process within a commercially available plasma sputter system available from such companies as Varian Associates, Inc. of Palo Alto, Calif. and Applied Materials, Inc. of Santa Clara, Calif. The sputtering process causes ionized atoms of an inert gas, such as argon, to strike an aluminum target, thereby dislodging aluminum atoms from the surface of the target, some of which will settle over the surface of dielectric layer $D_a$ and within the via hole $V_a$. As indicated by the arrows in FIG. 1a, the aluminum (Al) atoms can settle on the surface $D_a$ and within the via $V_a$ from a number of directions.

A problem encountered with this prior art method for forming vias is the so-called shadowing effect where the rim of the via hole $V_a$ can block angularly moving aluminum atoms from depositing within certain portions of the via holes. For example, in FIG. 1a, some aluminum atoms travelling angularly downwardly from left to right may be blocked by the left-side rim of the via hole $V_a$, while some aluminum atoms travelling angularly downwardly from right to left may be blocked by the right-side rim of the via hole. This tends to cause uneven deposition within the via hole $V_a$, creating a via having pronounced cusps $C_a$. These cusps are weak points in the via and can fracture, breaking the electrical connection through the via. Furthermore, as the via fills and the sidewalls of the via grow together, a void may form within the via which can be a further cause of potential failure of the via.

A prior art structure which reduces the shadowing effect in via holes is illustrated in FIG. 1b. This prior art structure includes a substrate layer $S_b$, a dielectric layer $D_b$, a via hole $V_b$, and a conductive layer $L_b$, where the rim of the via hole $V_b$ is beveled or tapered as shown at $T_b$ so that fewer of the angularly moving aluminum atoms are shadowed by the rim of the via hole. This reduced shadowing results in much smaller cusps $C_b$ and more uniform deposition within the via hole $V_b$.

A method for forming the prior art tapered rim via hole structure will be discussed with reference to FIG. 1c which shows a substrate layer $S_c$, a dielectric layer $D_c$ and a masking layer $M_c$. The masking layer $M_c$ includes a number of openings $O_c$ which correspond to the locations at which via holes are to be formed. As a first step, a recess $R_c$ is isotropically etched through the openings $O_c$ as illustrated in the left side of the figure. This isotropic etch is typically a "wet etch", i.e. is accomplished with a liquid acid such as hydrofluoric (HF) acid. Wet etching tends to be omnidirectional, and therefore causes undercutting of the mask layer $M_c$ to form tapered surfaces $T_c$. This wet, isotropic etch is then followed by an anisotropic etch to form the main body of the via hole, as illustrated on the right side of FIG. 1c. This anisotropic etch is typically a "dry etch", i.e. is accomplished within a plasma etch system which creates the nearly vertical sidewalls of a via hole $V_c$.

As the feature sizes of integrated circuits shrink, the diameters of via holes become correspondingly smaller, making it increasingly difficult to cause liquid acid to flow into the openings $O_c$ of the mask layer $M_c$ due to the surface tension of the liquid and due to residual air bubbles trapped within the openings $O_c$. Therefore, the wet etch portion of the prior art process for forming via holes with tapered rims is poorly adapted for the latest generations of very large scale integrations (VLSI) and ultra large scale integration (ULSI).

Another problem encountered with the wet etch process is particulate contamination. Even the purest of liquid etchants include many fine particles which can adhere to portions of the integrated circuit and possibly destroy the functionality of the integrated circuit. Since these particles are very difficult to filter out, each wet etch process adds statistically to the failure rate of each integrated circuit die, thereby reducing the yield of functioning integrated circuits per wafer.

The wet etch process also requires a subsequent water rinse and dry cycle to remove the remaining acid. Since even the purest of distilled water contains some contaminants, the rinse and dry cycle also adds particulate contamination of the wafer with a subsequent reduction in the yield of functional integrated circuits per wafer.

SUMMARY OF THE INVENTION

In the present invention, an isotropic etch is performed utilizing an acidic vapor, such as a vapor of HF, rather than the liquid acids utilized in the prior art. The acidic vapor penetrates the mask openings to isotropically etch a recess in the dielectric layer with substantial undercutting of the mask layer around the mask openings. The acidic vapor isotropic etch is followed by an anisotropic etch to form substantially straight-walled via holes having tapered rims.

Since the isotropic etch step is performed with an acidic vapor, there are no surface tension or wetting problems to prevent the vapor from penetrating the mask openings. In consequence, the process of the present invention is well suited to the latest generations of VLSI and ULSI integrated circuit manufacture.

Furthermore, since the isotropic etchant is provided in vapor form the possibilities of particulate contamination can be greatly reduced because the particles are left behind in the liquid source for the acidic vapor. Also, no rinse/dry cycle is required after the isotropic etch step, again reducing the chance for particulate contamination. Therefore, the use of the method of the present invention can increase yield by reducing the number of non-functional integrated circuit die on a wafer.

These and other advantages of the present invention will become clear to those skilled in the art upon a study of the detailed description of the invention and of the several figures of the drawings.

DETAILED DESCRIPTION OF THE PREFERRED EMBODIMENTS

Figure 1A:
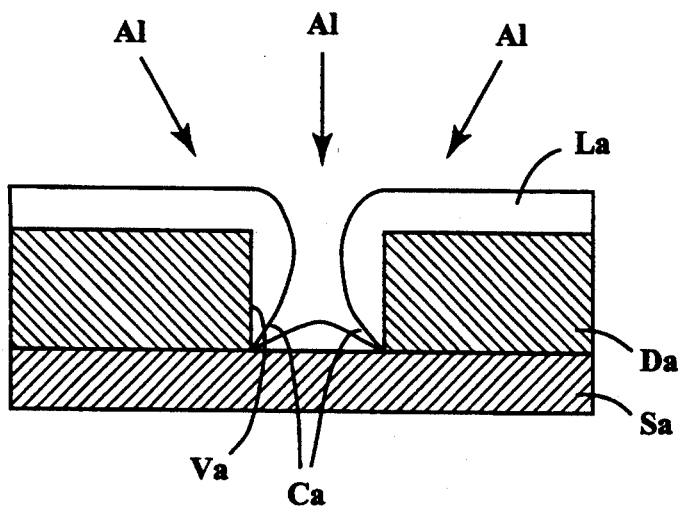
FIG. 1a illustrates a first prior art via hole structure which is particularly vulnerable to the shadowing effect during sputter deposition.
Figure 1B:
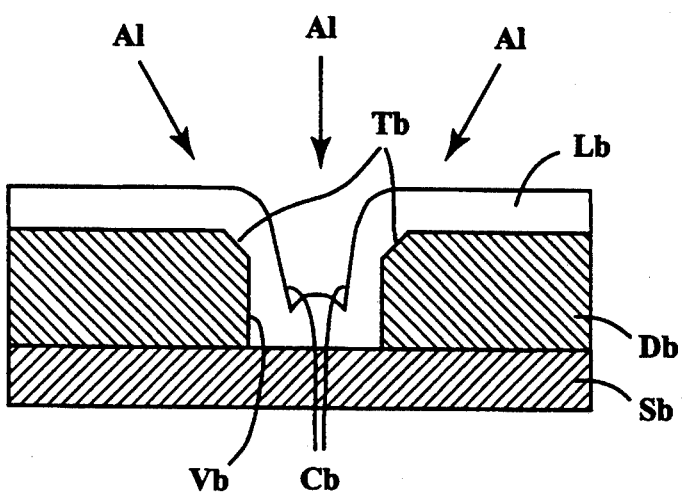
FIG. 1b illustrates a second prior art via hole structure which is less vulnerable to the shadowing effect during sputter deposition.
Figure 1C:
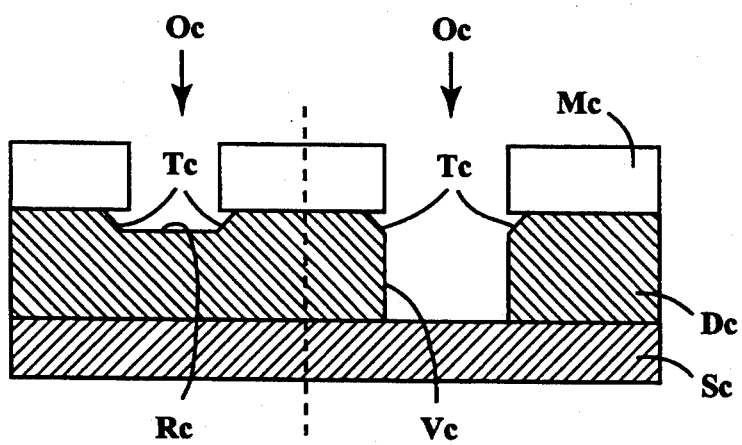
FIG. 1c illustrates a prior art process for producing the via hole structure shown in FIG. 1b.

Two prior art via hole structures were discussed with reference to FIGS. 1a and 1b. A prior art method for forming the via hole structure of FIG. 1b was discussed with reference to FIG. 1c. An improved process in accordance with the present invention for forming vias is illustrated in the flow diagram of FIG. 2.

Figure 2:
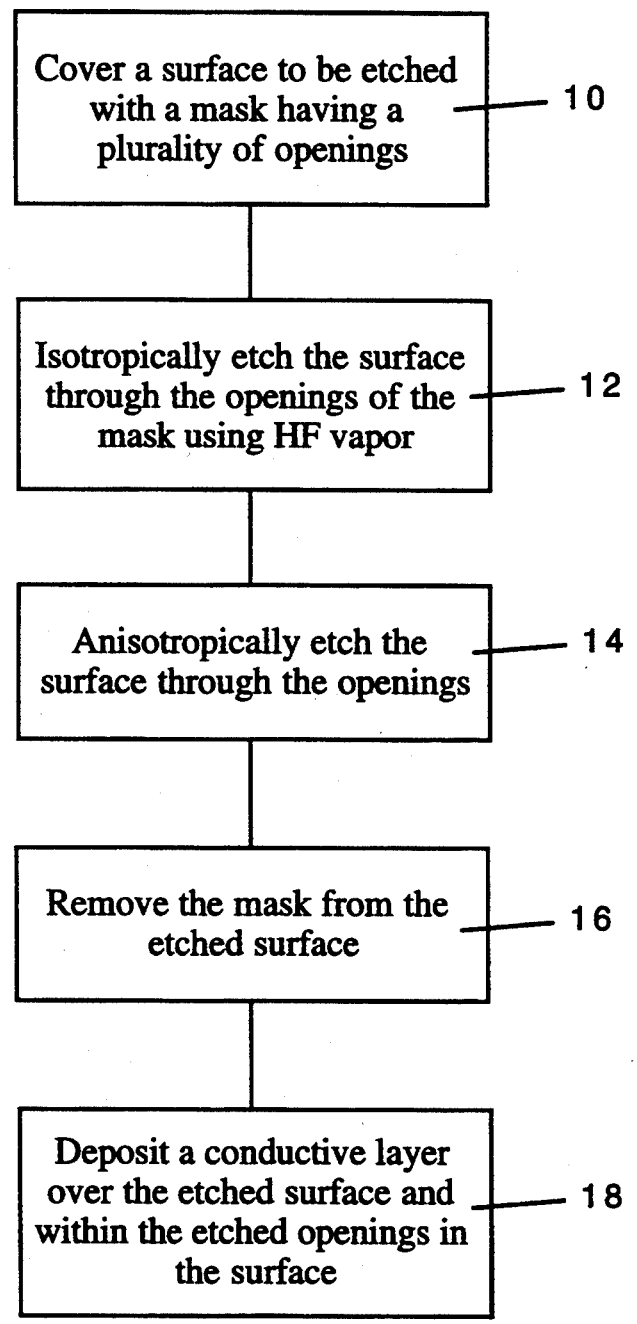
FIG. 2 is an improved method for producing the via hole structure shown in FIG. 1b.

As seen in FIG. 2, a first step 10 in accordance with the present invention is to cover a dielectric surface to be etched with a mask having a plurality of openings. The dielectric surface is then isotropically etched in a step 12 through the openings of the mask using an acidic vapor which preferably includes a vapor of hydrofluoric (HF) acid. The dielectric surface is next anisotropically etched in a step 14 through the mask openings to form the straight walls of the via holes and subsequently the mask is removed from the dielectric surface in a step 16. A conductive layer is then deposited over the dielectric surface and within the via holes in a step 18. The conductive layer can be subsequently partially or completely removed from the dielectric surface to leave conductive vias within the via holes.

Figure 3A:
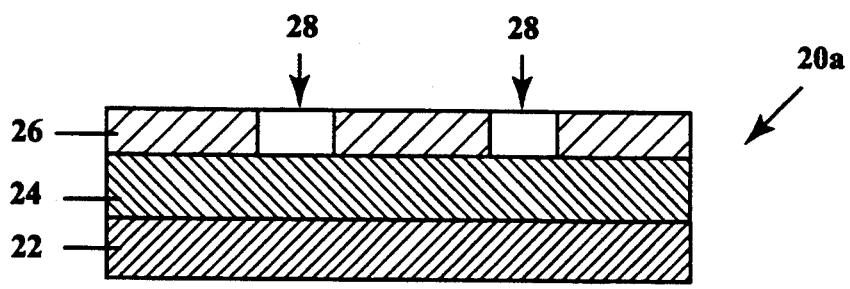
FIGS. 3a-3e successively illustrate an integrated circuit structure being processed by the method steps of FIG. 2.

The effects of these process steps are illustrated in FIGS. 3a-3e. In FIG. 3a, a multi-layer structure 20a includes a substrate 22, a dielectric layer 24, and a mask layer 26. The substrate 22 can be a semiconductor substrate, such as a silicon substrate, or it can be a layer formed over the semiconductor substrate. The dielectric layer 24 is typically an oxide or nitride, such as $SiO_2$ or $Si_3N_4$, or a boron or phosphorous doped oxide. The mask layer 26 is typically a photoresist material which is spun onto the dielectric layer 24 and photolithographically patterned to produce a number of openings 28 which correspond to the locations where the via holes are to be formed in the dielectric layer.

Figure 3B:
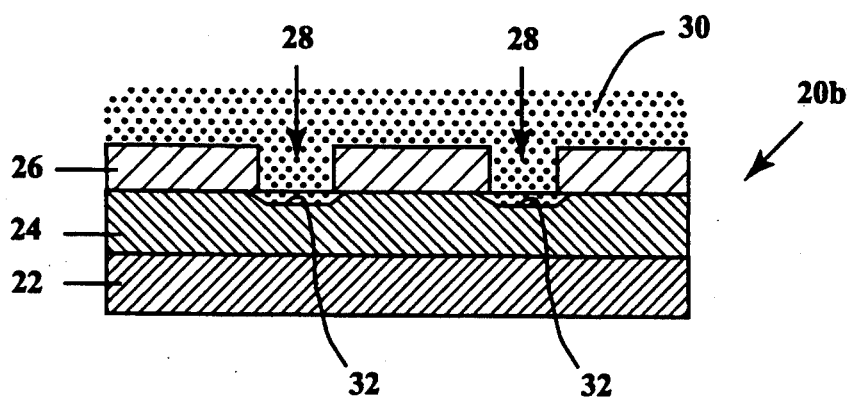

In FIG. 3b, the structure 20b is exposed to an acidic vapor 30 which penetrates the openings 28 of mask 26 to isotropically etch recesses 32 in the dielectric layer 24. Since the etch is isotropic, the mask layer 26 will be undercut around openings 28. The acidic vapor 30 is preferably substantially entirely in the gaseous state to promote diffusion into and through the openings 28 of the mask layer 26. However, the acidic vapor 30 can also include an aerosol of fine droplets which are similarly capable of entering the openings 28.

A vapor found to be particularly suitable for the isotropic etch step of the present invention is a vapor of hydrofluoric acid (HF). For the isotropic etch of an $SiO_2$ layer through a mask having openings on the order of 0.8 microns, the following conditions have been discovered to be suitable:

Pressure: 760 Torr
Temperature: 25° C.
$N_2$ flow: 8 liters/minute
HF flow: 100 cc/minute Under these conditions the etch rate of the $SiO_2$ is approximately 1 micron per minute. For a typical 0.8 micron via hole, the process would continue for 3 minutes to provide a recess 32 in the surface of the dielectric layer 24 which is approximately 0.3 microns deep and 0.6 microns across at its base.

It should be noted that the process can be conveniently performed at standard temperatures and pressures, i.e. at ambient room temperature and pressure. The nitrogen, which serves as a carrier gas and diluent for the HF vapor, is semiconductor grade anhydrous nitrogen available from such sources as Air Products and Chemicals, Inc. of Allentown, Pa. and Linde Specialty Gasses, a division of Union Carbide Corporation, Somerset, N.J. Other inert or relatively inert gasses such as Argon can be used in addition to or exclusively of the nitrogen carrier gas. The HF vapor is formed from semiconductor grade liquid HF in commercially available apparatus which will be described subsequently.

The etch rate can be varied considerably from about 300 angstroms/minute to about 12,000 angstroms per minute by varying the flow rates of the nitrogen carrier gas and the HF vapor. In general, the flow rate of the $N_2$ carrier gas is in the range of 1–30 liters/minute and the flow rate of the HF vapor is 0.01–1 liters/minute. The flow rates should be adjusted to prevent substantial condensation of the HF vapor on the various wafer surfaces or the formation of black silicon by the recombination of reactant byproducts with the wafer surfaces. If these conditions are met, no rinse/dry or other cleaning cycle will be required because the reactant byproducts will be carried away with the system's exhaust, leaving the wafer surfaces essentially dry and contamination free.

Figure 3C:
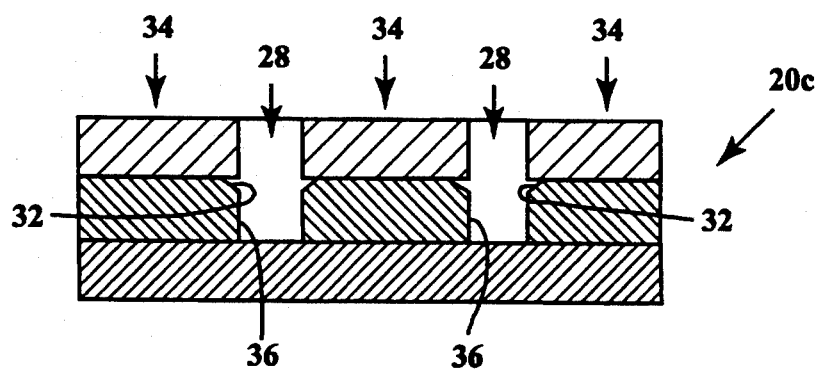

After the isotropic etch, the structure 20c is subjected to an anisotropic etch as illustrated in FIG. 3c. An anisotropic etch is typically performed in a plasma etch apparatus which causes positive ions 34 of an etchant gas to be accelerated substantially perpendicularly towards the structure 20c. This anisotropic etch, the process of which is well known to those skilled in the art, creates via holes 36 with substantially vertical sidewalls. Since the via holes 36 are formed through the recesses 32 which were formed by the isotropic etch the rim of the via holes 36 have the taper which is desired to reduce the shadowing effect during a subsequent metal deposition process.

Figure 3D:
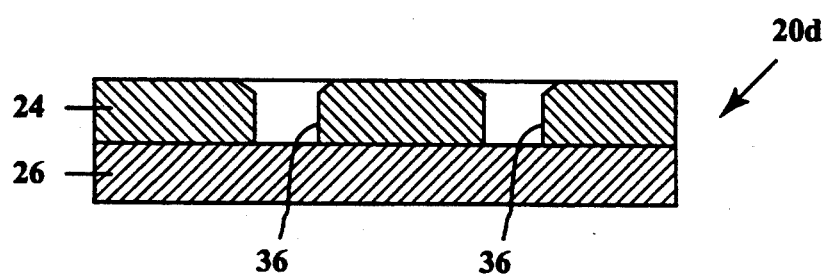

In FIG. 3d, the structure 20d is shown with the mask 26 removed. Here the via holes 36 with their tapered upper rims can be clearly seen.

Figure 3E:
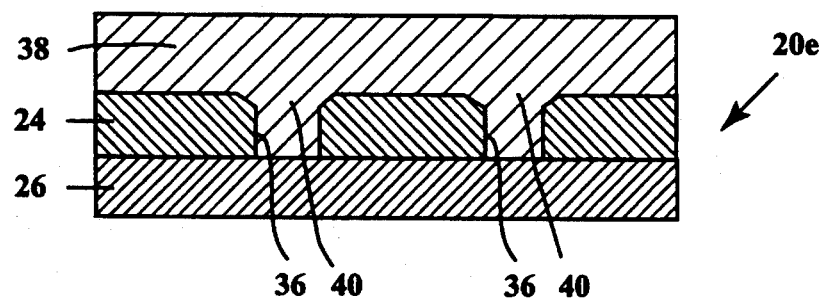

In FIG. 3e, the structure 20e includes the addition of a metal layer 38 which covers the dielectric layer 24 and fills the via holes 36 with vias 40. The tapered rim of the via holes permits the metal layer to substantially fill the via holes 36 to provide vias 40 which are substantially devoid of cusps and voids. The metal layer, which is preferably aluminum or tungsten, can be subsequently partially or completely removed from the surface of dielectric layer 24, leaving the vias 40 within the via holes 36.

The process of the present invention can be accomplished in commercially available machines. For example, Advantage Edge of Sunnyvale, Calif. produces the Advantage Edge 2000 Vapor Phase Oxide Etching System which is capable of supplying HF vapor from a liquid HF source and $N_2$ from a nitrogen source into a reaction chamber to perform the process of the present invention. The Advantage Edge system has been found to be less than ideal for the process of the present invention, however, since it is a low-pressure which can cause contamination due to outgassing by the photoresist layer. A more suitable machine for process of the present invention is the Excalibur Gas Processing System made by FSI International of Chaska, Minn. The Excalibur system is capable of delivering HF vapor and $N_2$ at substantially room temperatures and pressure into a process chamber which can accommodate wafers up to 200 mm in diameter. Both the Advantage Edge 2000 and the Excalibur are marketed as wafer surface cleaners and do not include a process for etching vias holes through a photoresist mask.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. A method for forming a tapered via hole in an integrated circuit layer comprising the steps of:
   covering a surface to be etched with a mask having at least one opening, said opening having an opening diameter of at most 0.8 microns;
   isotropically etching said surface through said opening with an acid vapor supplied at a flow rate that is not conducive to condensation of the acid vapor on the surface to provide a tapered recess in said surface that has a maximum diameter greater than said opening diameter; and
   anisotropically etching said surface through said opening and said tapered recess to form a via hole which has a diameter that is about the same as said opening diameter.

2. A method as recited in claim 1 wherein said acid vapor comprises HF.

3. A method as recited in claim 2 wherein said acid vapor further comprises an inert carrier gas.

4. A method as recited in claim 3 wherein said inert carrier gas is nitrogen.

5. A method as recited in claim 2 wherein said acid vapor of HF is caused to flow past said surface at a rate in the range of about 0.01 liter/minute to about 1 liter/minute.

6. A method as recited in claim 5 wherein said acid vapor of HF is caused to flow past said surface at a rate of about 0.1 liter per minute.

7. A method as recited in claim 4 wherein said nitrogen is caused to flow past said surface at a rate in the range of about 1 liter/minute to about 30 liters/minute.

8. A method as recited in claim 7 wherein said nitrogen is cause to flow past said surface at a rate of about 8 liters/minute.

9. A method as recited in claim 7 wherein said acid vapor of HF is caused to flow past said surface at a rate in the range of about 0.01 liter/minute to about 1 liter/minute.

10. A method as recited in claim 7 wherein said acid vapor of HF and said carrier gas of nitrogen are at approximately ambient temperature and pressure.

11. A method for forming a via in an integrated circuit layer comprising the steps of:
    covering a surface to be etched with a mask having at least one opening, said opening having an opening diameter of at most 0.8 microns;
    isotropically etching said surface through said opening with an acid vapor supplied at a flow rate that is not conducive to condensation of the acid vapor on the surface to provide a tapered recess in said surface that has a maximum diameter greater than said opening diameter;
    anisotropically etching said surface through said opening and said tapered recess to form a via hole which has a diameter that is about the same as said opening diameter;
    removing said mask from said surface; and
    depositing a conductive material over said surface and within said via hole.

12. A method as recited in claim 11 wherein said acid vapor comprises an HF vapor and a carrier gas.

13. A method as recited in claim 12 wherein said HF is caused to flow past said surface at a rate in the range of about 0.01 liter/minute to about 1 liter/minute and wherein said carrier gas is caused to flow past said surface at a rate in the range of about 1 liter/minute to about 30 liters/minute.

14. A method as recited in claim 13 wherein said HF vapor and said carrier gas are at about ambient pressures and temperatures.

15. A method as recited in claim 12 wherein said carrier gas comprises nitrogen.

16. A method for forming a via substantially without cusps and voids in an integrated circuit layer comprising the steps of:
    covering a surface to be etched with a mask having at least one opening, said opening having an opening diameter of at most 0.8 microns;
    isotropically etching said surface through said opening with vapor comprising HF, said vapor being supplied at a flow rate that is not conducive to condensation of the vapor on the surface and carried by a nitrogen carrier, to provide a tapered recess in said surface that has a maximum diameter greater than said opening diameter;
    anisotropically etching said surface through said opening and said tapered recess to form a via hole which has a diameter that is about the same as said opening diameter;
    removing said mask from said surface; and
    depositing a conductive material over said surface and within said via hole to substantially fill said via hole and provide said via substantially without cusps and voids.

17. A method as recited in claim 16 wherein said vapor is caused to flow past said surface at a rate in the range of about 0.01 liter/minute to about 1 liter/minute.

18. A method as recited in claim 16 wherein said vapor is caused to flow past said surface at a rate of about 0.1 liter per minute.

19. A method as recited in claim 17 wherein said nitrogen is caused to flow past said surface at a rate in the range of about 1 liter/minute to about 30 liters/minute.

20. A method as recited in claim 17 wherein said nitrogen is cause to flow past said surface at a rate of about 8 liters/minute.

21. A method as recited in claim 17 wherein said vapor and said nitrogen are at approximately ambient temperature and pressure.

22. A method as recited in claim 16 wherein said step of isotropically etching is accomplished at an etch rate in the range of about 300 angstroms per minute to about 12,000 angstroms per minute.

* * * * *